United States Patent [19]

Miyazawa

[11] Patent Number: 5,585,306
[45] Date of Patent: Dec. 17, 1996

[54] METHODS FOR PRODUCING COMPOUND SEMICONDUCTOR DEVICES

[75] Inventor: Seiichi Miyazawa, Zama, Japan

[73] Assignee: Canon Kabushiki Kaisha, Tokyo, Japan

[21] Appl. No.: 193,871

[22] Filed: Feb. 8, 1994

Related U.S. Application Data

[63] Continuation of Ser. No. 794,464, Nov. 19, 1991, abandoned.

[30] Foreign Application Priority Data

Nov. 19, 1990 [JP] Japan .................................. 2-313438

[51] Int. Cl.$^6$ ..................................................... H01L 21/20
[52] U.S. Cl. ................................. 437/129; 117/88; 117/89
[58] Field of Search ..................................... 437/129, 132, 437/126; 148/DIG. 95; 117/88, 89

[56] References Cited

U.S. PATENT DOCUMENTS 4,878,218  10/1989  Pessa et al. .............................. 437/132

OTHER PUBLICATIONS

Y. Horikoshi, et al "Low–Temperature Growth of GaAs and AlAs–GaAs Quantum–Well Layers by Modified Molecular Beam Epitaxy" Japanese J. Appl. Phy. vol. 25, No. 10, Oct. 1986 pp. L868–L870.

H. Künzel, et al "Quantitative Evaluation of Substrate Temperature Dependence of Ge Incorporation in GaAs During Molecular Beam Epitaxy" Applied Physics 22, 23–30 (1980).

S. Miyazawa, et al "Low–temperature molecular beam epitaxy growth of single quantum well GaAs/AlGaAs lasers" Japanese J. Appl. Phys. 2, Lett. vol. 30, No. 5B pp. L921–L923, 15 May 1991 (abstract only).

Primary Examiner—Robert Kunemund
Assistant Examiner—Linda J. Fleck
Attorney, Agent, or Firm—Fitzpatrick, Cella, Harper & Scinto

[57] ABSTRACT

In a method for producing a compound semiconductor device such as laser devices, FET and HEMT, a crystal layer is formed with materials belonging to at least two (first and second) different groups of the periodic law table under a crystal growth condition under which a value equal to the number of arrival molecules of the material of the first group having a higher vapor pressure divided by the number of arrival molecules of the material of the second group having a lower vapor pressure is equal to or less than 2.5. More preferably, this value is equal to or less than 2.0. More concretely, the crystal layer is made of V/III group elements, for example, As of group V and at least Ga of group III. Under such condition, the crystal layer can be grown with a high quality at relatively low substrate temperatures lower than 500° C.

7 Claims, 16 Drawing Sheets

METHODS FOR PRODUCING COMPOUND SEMICONDUCTOR DEVICES

This application is a continuation of application Ser. No. 07/794,464 filed Nov. 19, 1991, now abandoned.

BACKGROUND OF THE INVENTION

1. Field of the Invention

This invention relates to semiconductor devices in which a substrate or a layer formed thereon is composed of GaAs, AlGaAs, Si, ZnSe or the like and methods for producing the semiconductor devices at substrate or growth temperatures of relatively low values, for example, not greater than 500° C.

2. Related Background Art

Conventionally, it has been reported that the threshold current density of a semiconductor laser fabricated by the molecular beam epitaxy (MBE) method was raised when the semiconductor laser was produced at a growth temperature in a relatively low temperature range, as, for example, Appl. Phys. Lett. Vol. 36, p. 118 (1980) W. T. Tsang et al. discloses. FIG. 1 shows the structure of such laser. FIG. 2 illustrates the relationship between the threshold current density $J_{th}$ and the substrate temperature.

In FIG. 1, there are formed, on an n-GaAs substrate 201, an Si doped GaAs buffer layer 202 having a thickness of 0.5 μm, an Si doped $Al_{0.3}Ga_{0.7}As$ layer 203 having a thickness of 1.5 μm, an undoped GaAs active layer 204 having a thickness of 0.1 μm, a Be doped $Al_{0.3}Ga_{0.7}As$ layer 205 having a thickness of 1.5 μm, a Be doped GaAs contact layer 206 having a thickness of 0.5 μm and a Cr/Au alloy electrode 207 deposited on the contact layer 206. After the n-GaAs substrate 201 is thinned to a thickness of 100 μm, an AuGe/Ni/Au electrode 208 is deposited on the bottom surface of the substrate 201.

As is seen from FIG. 2 showing a substrate temperature dependency of threshold current density $J_{th}$ of the thus fabricated laser which has a stripe width of 100 μm and a cavity length of 300 μm, the $J_{th}$ of such laser is small near the substrate temperature of 650° C. Namely, its performance is improved near such substrate temperature. In contrast, $J_{th}$ becomes greater than 14 kA/cm² in the vicinity of substrate temperature of 300° C. This value of threshold current density far surpasses the value of about 3 kA/cm² below which a laser can practically be utilized. Thus, it is seen that the characteristic of a laser is lowered at such low substrate temperatures.

In recent years, there has been a growing interest in opto-electronic integrated circuits (OEIC) in which optical devices and electric or electronic devices are integrated on a common substrate (see J. Vac. Sci. Technol. B2(2), 259 (1984). Very low threshold current GaAs-AlGaAs GRIN-SCH lasers grown by MBE for OEIC applications). the OEIC features an enhanced reliability, relatively low cost, compactness in size and so forth, and is considered an important technology. However, its fabrication temperature becomes a problem when the integration is conducted.

That is, in conventional methods, the fabrication or substrate temperature is high when devices are produced, and hence inter-diffusions of composite elements and impurities are caused, leading to incapability of creating ideal doping profiles or distributions and ideal structures. As is described above, optical devices such as semiconductor lasers are usually fabricated at temperatures greater than 600° C., and presently at still higher temperatures of about 700° C. in order to better their performances. In contrast, electronic devices are principally produced at the growth temperature of about 500° C. so that inter-diffusions of impurities or the like should be prevented. So, there is presently a temperature difference of about 200° C. between fabrication temperatures of optical devices and electronic devices.

Therefore, electronic devices are always produced after optical devices have been fabricated in order to achieve their integration while maintaining good characteristics of the electronic devices. Thus, the fabrication process becomes complicated since a plurality of epitaxial growths having different steps are to be conducted.

FIG. 3 illustrates an example of diffusion in Si doped GaAs. As seen from FIG. 3, an ideal doping shape 182 in fact greatly collapses at the growth temperature of 550° C. as indicated by dash and dotted lines 183.

As is discussed in the foregoing, a low temperature growth is a very critical technique in semiconductor processes. In particular, a low temperature growth of semiconductor lasers which are key optical devices is important for the integration of optical and electronic devices.

A hetero-epitaxy technique for growing a III–V group compound semiconductor such as GaAs on an Si substrate has been particularly highlighted in recent years in the light of hetero-junctions with lattice mismatching. If GaAs and the like can be grown on an Si substrate, a less expensive substrate having a large area becomes available, and hence the following advantages will be obtained. ① A highly efficient solar battery can be obtained. ② It becomes possible to monolithicly form Si and GaAs materials, and hence OEIC's with satisfying performances can be achieved. ③ High speed GaAs ICs and high electron mobility transistor (HEMT) ICs can be fabricated on a substrate having a large area. ④ Heat radiation of power devices and semiconductor devices is improved because Si has a larger thermal conductivity than GaAs.

However, such growths are difficult to attain by usual methods since there exist 4% lattice mismatching and a difference in thermal expansion coefficients between Si and GaAs.

There have been developed the following methods for alleviating the lattice mismatching between Si and GaAs. ① A GaAs/Ge/Si structure is fabricated using an intermediate layer of Ge. ② After an Si substrate is cleaned at high temperatures, a thin, amorphous GaAs layer is grown at low temperature and the temperature is raised in order to grow GaAs at normal growth temperatures. This is a two-step growth method for obtaining a structure of GaAs/low temperature GaAs/Si. ③ A GaAs/AlGaAs super-lattice is grown on Si and then GaAs is grown thereon to produce a structure of GaAs/GaAs-AlGaAs super-lattice/Si. ④ A strain super-lattice is formed as an intermediate layer to obtain a structure of GaAs/strain super-lattice/Si.

The MBE and metal organic-chemical vapor deposition (MOCVD) methods are used for growth of layers, and single crystal GaAs has been obtained in all of those methods.

Samples of various devices such as FETs, solar batteries and semiconductor lasers are made using GaAs grown on Si. It has also reported that a GaAs/AlGaAs double hetero-laser fabricated on an Si substrate was successfully radiated at room temperature, though this is inferior to those grown on a GaAs substrate in characteristic.

FIGS. 4A, 4B and 5 show characteristics of such example and its structure. In FIG. 5, an MOCVD apparatus at normal temperatures is used. There are provided, on an n-type Si substrate of (100) 2° off, a GaP layer 172 having a thickness of 0.1 μm formed at temperature of 900° C., a GaP/GaAsP strain super-lattice (20 nm/20 nm×5) layer 173 formed at 750° C., an n-GaAs layer 174 having a thickness of 2 μm and impurity concentration of $2 \times 10^{18}$ cm$^{-1}$, an n-Al$_x$Ga$_{1-x}$As lower cladding layer 175 having a thickness of 1.4 μm and impurity concentration of $1 \times 10^{18}$ cm$^{-3}$, an undoped GaAs active layer 176 having a thickness of 0.08 μm, a p-Al$_x$Ga$_{1-x}$As upper cladding layer 177 having a thickness of 1.4 μm and impurity concentration of $4 \times 10^{17}$ cm$^{-3}$ and a p-GaAs layer 178 having a thickness of 0.65 μm and impurity concentration of $1.3 \times 10^{18}$ cm$^{-3}$. On this structure, an Au-Zn/Au electrode 180 is deposited at a p-side while an Au-Ge/Au electrode 181 is deposited at an n-side. Its stripe width and cavity length are respectively set to 10 μm and about 100 μm.

FIG. 4A illustrates the characteristic of a laser formed on a GaAs substrate, and FIG. 4B illustrates the characteristic of the above-mentioned laser produced on Si substrate 171. It can be seen therefrom that oscillations of the TE+TM mode and TM mode occur in the laser on Si while an oscillation of only TE mode is caused in a double-hetero (DH) laser on GaAs. This phenomenon is considered to be attributable to the fact that the GaAs layer grown on Si receives a strain of about $10^9$ dyn/cm$^2$ since the thermal expansion coefficient is different between Si and GaAs and that its degenerated hole energy level is split to create light and heavy hole levels.

Thus, although the laser oscillation is somehow achieved in the laser produced on an Si substrate with improvement, such semiconductor laser has the following drawbacks as yet.

① Presently, a GaAs layer grown on Si substrate has an etch pit of $1 \times 10^6$ cm$^{-2}$, but the value of the etch pit is preferably less than $1 \times 10^{-3}$ cm$^{-2}$ in light of the lifetime of lasers. ② The GaAs laser is produced at a high temperature of 700° C., and hence a large stress occurs due to the difference in thermal expansion coefficient between Si and GaAs. In fact, this influence appears in the laser characteristics of TM mode oscillation and the like.

Thus, strain and the like have not yet been solved completely due to the differences in lattice constants between Si and GaAs and in thermal expansion coefficient, and the lifetime of laser is adversely affected. Unless those problems are solved, it is difficult to reduce such semiconductor lasers fabricated on the Si substrate into practice.

From this standpoint, the technique of growth of optical devices at low temperatures is also a key technique.

Next, a compound technique of semiconductor materials is important for optical communication technique, display technique and the like.

For example, it has been attempted to integrate semiconductor materials corresponding to three primary colours of light on a common substrate for satisfying requirements of flat panel displays and the like. As examples of such materials, AlGaAs can be cited for red colour, GaP for yellow, and ZnSe for blue. A GaAs substrate can generally be cited as a substrate. Lattice constants of AlGaAs, GaP and GaAs are generally equal to each other, and light emitting diodes and semiconductor lasers and the like using these materials are already reduced into practice. Devices using ZnSe, however, have not yet been employed practically. This is because a proper doping of ZnSe is hard to perform and because the growth temperature of ZnSe is quite different from that of GaAs layers. In general, an optimum growth condition of ZnSe resides in a range between 250° C. and 350° C. while that of GaAs is in a range higher than 500° C.

Therefore, it has been usual in conventional growth examples to fabricate ZnSe on the GaAs substrate at temperatures from 250° C. to 350° C. If a GaAs layer were grown on a ZnSe layer, inter-diffusions of Ga, As, Zn and Se occur and an n-p junction would be formed at a boundary plane between GaAs and ZnSe.

FIGS. 6 and 7 show such examples. In FIG. 6, an n-ZnSe layer 152 is formed on an n-GaAs substrate 151. The growth temperature therein is 300° C. Then, as shown in FIG. 7, an n-GaAs layer 153 is grown at the growth temperature of 500° C. At this time, Zn is diffused from the ZnSe layer 152 to the GaAs layer 153. As a result, part 155 of the GaAs layer 153 becomes a p-type GaAs region. Similarly, Ga is diffused from the GaAs layer 153 to the ZnSe layer 152 and an n-type region 154 is formed in the ZnSe layer 152. Consequently, an npn junction is created between substrate 151 and GaAs layer 153.

Thus, except for the junction between n-ZnSe and p-GaAs, such a device having a diode characteristic will inevitably be created. This is a great obstacle to the achievement of ZnSe devices.

In order to fabricate an efficient light emitting device, such material having a different band gap from ZnSe and at the same time having a lattice constant equal thereto is needed. As materials satisfying these conditions, GaAs and AlGaAs series are considered appropriate.

Thus, a need for realizing ZnSe devices is great and for this purpose it is desired to establish a low temperature growth technique without inter-diffusions. If such technique is established, it becomes possible to integrate light emitting devices including a ZnSe layer, GaAs devices, ZnSe devices, GaP devices and so forth on a common substrate. Further, this technique is an important technique for crystalline growth of II–VI group systems whose growth temperature is generally low.

From such standpoint of view, it is also important to establish the low temperature growth technique for optical devices and the like.

SUMMARY OF THE INVENTION

An object of the present invention is to provide a method for producing semiconductor devices and such semiconductor devices in which inter-diffusions are eliminated and stress due to the difference in thermal expansion coefficients is suppressed to obtain layers with good performance at low temperatures.

According to one aspect of the present invention, a method for producing a compound semiconductor device is characterized in that a crystal layer of the device to be formed with materials belonging to at least two (first and second) different groups of the periodic law table is formed under a crystal growth condition under which a value equal to the number of arrival molecules of the material of the first group having a higher vapor pressure divided by the number of arrival molecules of the material of the second group having a lower vapor pressure is 2.5 or less than 2.5, or more preferably 2.0 or less than 2.0.

As used herein, the term "arrival molecules" will be understood to mean the molecules arriving at the surface of the crystal layer into which part of them are to be incorporated.

More concretely, the crystal layer is made of V/III group elements (for example, As of the group V and at least Ga of the group III, and in this case the above-mentioned value is referred to as a V/III group flux ratio or simply a flux ratio (=γ)), and at least part of the layered crystal layers are formed by the MEE method.

According to another aspect of the present invention, a compound semiconductor device such as a semiconductor laser is characterized in that a crystal layer of the device formed with materials (for example, As of the group V and Ga, As and the like of the group III) belonging to at least two (first and second) different groups of the periodic law table under a crystal growth condition under which a value equal to the number of arrival molecules of the material of the first group having a higher vapor pressure divided by the number of arrival molecules of the material of the second group having a lower vapor pressure is 2.5 or less than 2.5, or more preferably 2.0 or less than 2.0, exists between a substrate and an active layer.

The principle of the present invention will be explained hereinbelow, taking the V/III groups as an example.

Conventionally, the flux ratio of AlGaAs (Al content or more fraction is 0.5) has been greater than 3. The reason therefor is, for example, that As re-evaporation on a substrate surface energetically occurs at high growth temperatures (greater than 500° C.) and an excessive amount of As should be supplied for compensating for the energetic re-evaporation. Therefore, in the examples of FIGS. 1 and 5, the flux ratio is 4 or 5.

In contrast, excessive As would be supplied at low growth temperatures (500° C. or less, this range is considered to be a temperature range in which impurities added to GaAs will not move by heat treatment) if the flux ratio is the same as that at high growth temperatures. That is, the formation of vacancy of Ga and Al of the group III becomes easier and the quality of the compound semiconductor crystal will be lowered. In the present invention, therefore, the flux ratio is made not greater than 2.5, more desirably, not greater than 2.0, to reduce a supply ratio of As.

As a result, semiconductor devices having high quality semiconductor crystal layers can be produced at low substrate temperatures of 500° C. or less, which has not been achieved in prior art examples. Since the fabrication is conducted at low substrate temperatures, stress will be reduced in devices having GaAs layers on Si and interdiffusion or auto-doping of materials will be decreased when ZnSe of II/VI group is layered on GaAs.

Furthermore, the quality of crystal will be made still higher according to the combination of low flux ratio growth method and the MEE method.

FIGS. 8A–8C illustrate relationships between flux ratio γ, substrate or growth temperature and PL intensity (this indicates the quality of crystal) or threshold current density (this indicates the characteristic of the semiconductor laser) for demonstrating the quality of crystal growth according to the present invention. FIG. 8A shows the flux ratio dependency of threshold current density of semiconductor lasers. The threshold current density becomes minimum near the flux ratio of 1.5 when the substrate temperature is 350° C., while the flux ratio for obtaining a minimum threshold current density increases as the substrate temperature is raised to 630° C. and further to 720° C. Therefore, in order to optimize the threshold current density at substrate temperatures of 500° C. or less, the flux ratio is needed to be 2.5 or less than 2.5, or more desirably 2.0 or less than 2.0.

FIGS. 8B and 8C show the substrate temperature dependency of PL intensity, with the flux ratio of GaAs and AlGaAs (Al content is 0.3) as a parameter. When compound semiconductor layers are grown, Ga is supplied as a single atom of Ga while As is supplied as a molecular structure having four atoms. Therefore, when the molecule amount of $As_4$ is indicated by $J_{As4}$ and the atom supply amount of Ga is indicated by $J_{Ga}$, the flux ratio can be represented by $J_{As4}/J_{Ga}$. How to calculate the flux ratio in MBE method will be explained below. The flux ratio of AlGaAs is defined by $J_{As4}/(J_{Ga}+J_{Al})$ since Al of group III is added and the sum of numbers of atoms of Ga and As is compared with the number of molecules of $As_4$.

As is seen from FIGS. 8B and 8C, the quality of AlGaAs and GaAs is strongly dependent on the supply ratio between groups III and V, that is, the flux ratio, and crystal has to be grown only at low flux ratios (2.5 or less than 2.5, or more preferably 2.0 or less) in order to obtain high quality crystal at low growth temperatures (500° C. or less). The present invention aims to realize semiconductor devices having a good performance by high quality compound semiconductor crystal layers grown at low temperatures utilizing the above-mentioned principle.

The flux ratio mentioned above represents a supply ratio between four atoms of As and an atom of Ga or Al. In the case of molecules of $As_4$, the number of atoms of As attributed to the growth is two. Therefore, when the flux ratio is 0.5, atoms of Ga and As are supplied at a ratio of 1:1. When the flux ratio between $As_4$ and Ga is 1, two atoms of As are supplied while one atom of Ga is supplied (this model is reported by Foxon and Joyce, and see Surface Science 64, 293 (1977)).

As previously state, the supply ratio between atoms of Ga and As of 1:1 is not optimal, and the reason therefor is that re-evaporation of As atoms occurs on the substrate surface.

As a supply state of As, there are cases of $As_2$ being formed with two As atoms and an organic bonding state. The low temperature growth according to the present invention is possible in other methods such as the MOCVD method, the MOMBE method and the like if a ratio between atom numbers of supplied atoms of groups V and III is about less than 4 (about less than 2 in terms of flux ratio). Further, at least part of the supplied material may be ionized (e.g., plasma) only if a molecule ratio of supplied atoms or molecules meets the above-mentioned requirement.

Next, the relationship between flux ratio and vapor pressure in the MBE method is mainly utilized in the following embodiments.

The flux ratio in the MBE method is given by vapor pressures of respective elements measured by a Beam Flux Monitor (BFM) and temperatures of the respective elements. Generally, the position of the BFM for measuring the pressure is a growth position where the substrate is set. Temperatures of respective materials are measured by bringing a thermocouple into contact with a crucible containing each material.

The relationship between vapor pressure and the number of reaching molecules is represented by:

$$J_i = A \cdot P_i / \eta_i \cdot (T_i/M_i)^{1/2} \quad (i=Ga, Al, As_4)$$

where $J_i$ is the number of molecules of each reaching material, $P_i$ is a vapor pressure of each molecule measured by BFM, $T_i$ is the temperature of each material at this time, $M_i$ is the mass number of each material, A is a proportional constant and $\eta_i$ is a sensitivity correction factor. A nude ion gauge used in the BFM generally performs the sensitivity calibration by nitrogen. Therefore, when Ga, Al, $As_4$ and the like are measured, a sensitivity correction is needed. The sensitivity correction formula is given by:

$$\eta_i = \eta_{N2} \times (0.6 \cdot Z_i/Z_{N2} + 0.4)$$

where $\eta_{N2}=1$ and the atomic number $Z_{N2}$ is 14.

Flux ratios of GaAs and AlGaAs are respectively obtained by:

$$\gamma_{GaAs} = J_{As4}/J_{Ga}$$

$$\gamma_{AlGaAs} = J_{As4}/(J_{Ga}+J_{Al}).$$

A general growth example is as follows. Vapor pressures are respectively GA: $4.3 \times 10^{-7}$ Torr (crucible temperature of Ga is 803° C.), Al: $2.4 \times 10^{-7}$ Torr (crucible temperature of Al is 990° C.) and As: $1 \times 10^{-5}$ Torr (crucible temperature of As is 256° C.). The flux ratio is obtained under such condition. Under this condition, the growth speed of GaAs is 0.7 μm/h and that of AlAs is 0.7 μm/h. The flux ratio is given by:

$$\gamma_{GaAs} = J_{As4}/J_{Ga} = 2.47$$

$\gamma_{AlGaAs} = J_{As4}/(J_{Ga}+J_{Al}) = 0.9$ (in this case Al content of AlGaAs is 0.5). Respective constants are $Z_{Ga}=31$, $Z_{Al}=13$, $Z_{As4}=132$, $M_{Ga}=69.72$, $M_{Al}=27$ and $M_{As4}=300$.

When the supply state of As is $As_2$, the calculation is easily effected by making the mass number ½. In the case of $As_2$, all of the supplied As is basically considered to attribute to the growth. Therefore, the condition for low temperature growth is to make the flux ratio 2.5 or less, similarly to the case of $As_4$.

These advantages and others will be more readily understood in connection with the following detailed description of the preferred embodiments in conjunction with the drawings.

DESCRIPTION OF THE PREFERRED EMBODIMENT

Figure 9:
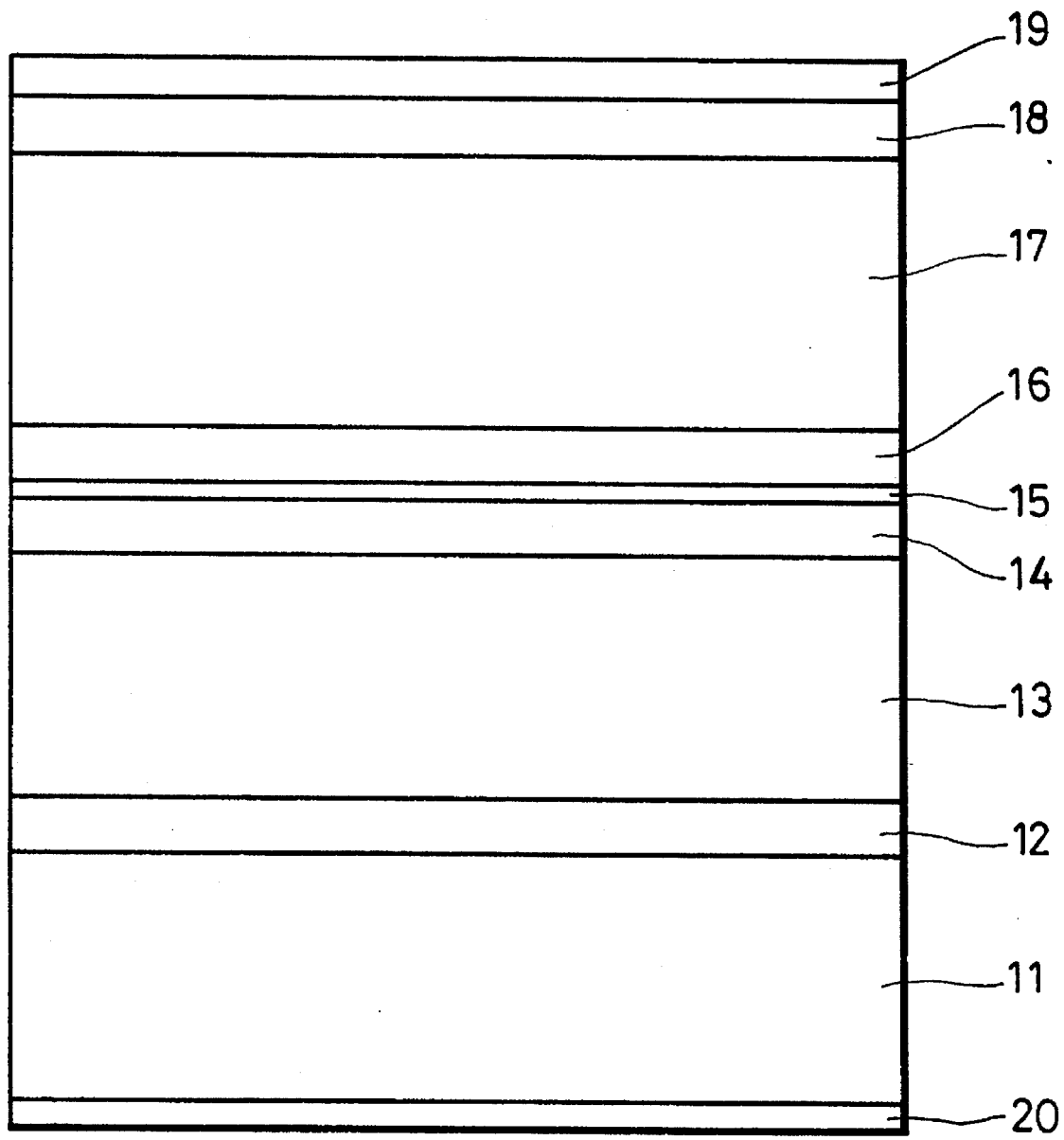
FIG. 9 is a view showing a first embodiment of the present invention.

FIG. 9 shows a first embodiment of the present invention. In a single quantum well (SQW) laser of the first embodiment, there are formed, on an n-GaAs substrate 11, an Si doped GaAs buffer layer 12 having a thickness of 0.5 μm and an Si doped $Al_{0.5}Ga_{0.5}As$ layer 13 having a thickness of 1.5 μm.

Further, an undoped $Al_yGa_{1-y}As$ light confinement layer 14 having a thickness of 2000 Å is formed and this Al mole fraction y gradually varies from 0.5 to 0.3 toward an active layer 15. The active layer 15 is comprised of an undoped GaAs layer having a thickness of 70Å, and an undoped $Al_zGa_{1-z}As$ upper light confinement layer 16 having a thickness of 2000 Å is formed on the active layer 15. Here, the Al mole fraction z also varies from 0.3 to 0.5 symmetrically to the lower light confinement layer 14 with respect to the active layer 15. Further, a Be doped $Al_{0.5}Ga_{0.5}As$ layer 17 having a thickness of 1.5 μm and a Be doped GaAs cap layer 18 having a thickness of 0.5 μm are formed. Thereafter, the substrate 11 is made thin to about 100 μm, and an AuGe/Ni/Au electrode 20 is formed at an n-side while a Cr/Au electrode 19 is formed at a p-side. In the growth process of the first embodiment, in order to make the group V/III flux ratio not greater than 2, As pressure is set to $1 \times 10^{-5}$ Torr when $Al_{0.5}Ga_{0.5}As$ cladding layers 13 and 17 are grown. In contrast, As pressure is set to $5 \times 10^{-6}$ Torr when GaAs layers such as the active layer 15 are grown.

As a result, the flux ratio becomes 0.9 when $Al_{0.5}Ga_{0.5}As$ is grown and the flux ratio becomes 1.25 when GaAs is grown. These values are not greater than 2.5 and 2.0 mentioned above, and hence the first embodiment is produced under the condition that the supply amount of As is lowered.

Figure 10:
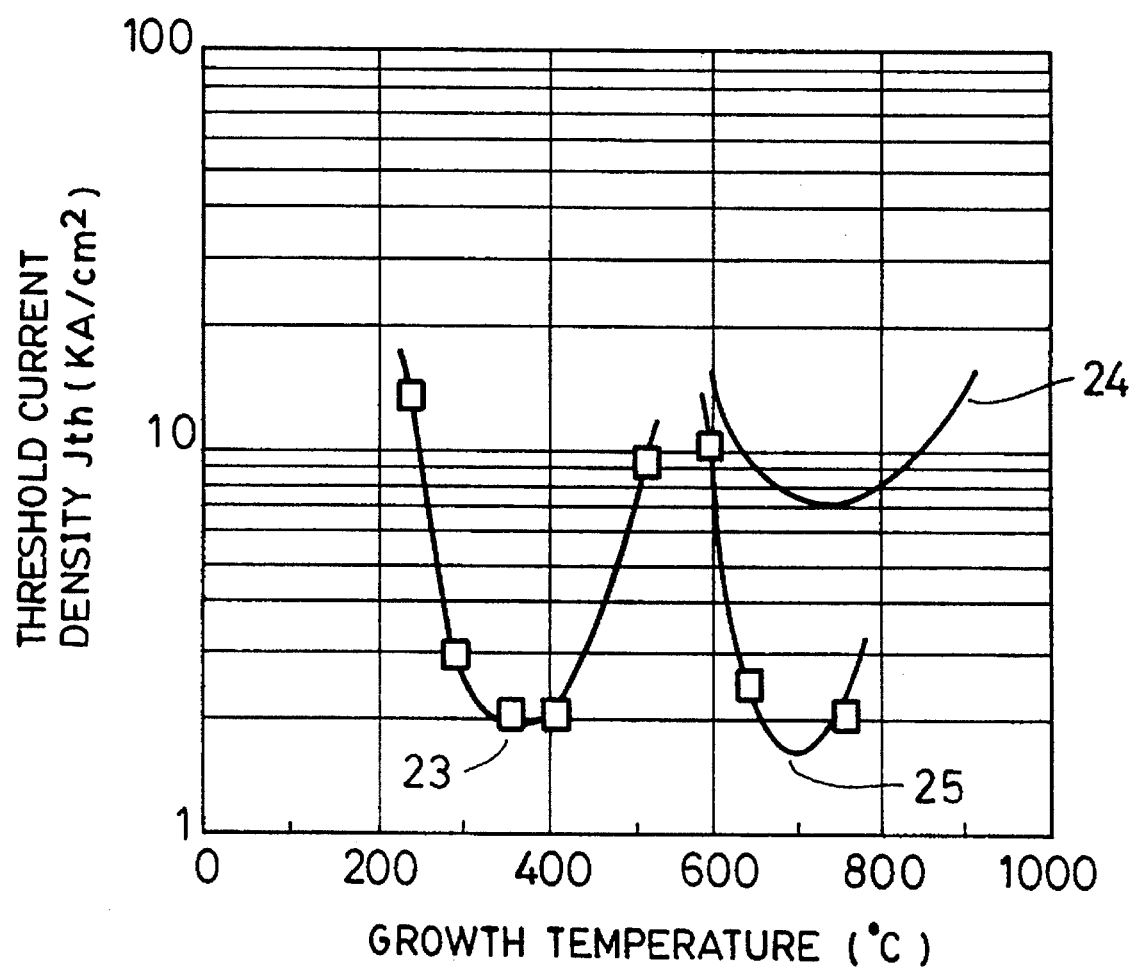
FIG. 10 illustrates a graph for showing the substrate temperature dependency of threshold current density of the first embodiment.

FIG. 10 illustrates the relationship between threshold current density of the thus fabricated laser and substrate temperature. From FIG. 10, it can be seen that the threshold current density $J_{th}$ has two local minimum points and that one indicated by reference number 23 is near the substrate temperature of 350° C. and the other one indicated by reference numerals 24 and 25 is near 700° C. It should be noted that flux ratios are different between the points 24 ad 25 as will be explained below. As is described above, lasers are usually grown at high temperatures higher than 600° C., but in the present invention it is found that there exists a local minimum point of $J_{th}$ in a low temperature range.

Explaining the flux ratio dependency of threshold current density $J_{th}$ in a high temperature range of 700° C., a curve 24 exhibits the tendency of $J_{th}$ of lasers fabricated under the condition of the above-discussed first embodiment (flux ratio is not greater than 2), while a curve 25 shows the tendency of $J_{th}$ of lasers whose layers are grown under a condition of flux ratio of 3 (this value is larger than 2.5). From this fact, it can be seen that the flux ratio should be greater than 3 in order to obtain a minimum of $J_{th}$ in a high temperature range. This is because the re-evaporation of As increases in the high temperature range, as state above.

Thus, it has been demonstrated that when at least layers under the active layer 15 (i.e., layers between the substrate 11 and the active layer 15) are grown under the condition of a flux ratio not greater than 2.5 (more preferably not greater than 2.0), lasers which are practically usable can be produced at a low growth temperature (not higher than 500° C.)

The characteristic of a semiconductor laser depends on the quality of crystal layers more greatly than those of electric or electronic devices, and hence the fact that practically usable lasers are fabricated means that the quality of crystal of compound semiconductor layers fabricated at a low temperature of 350° C. is quite excellent.

Figure 11:
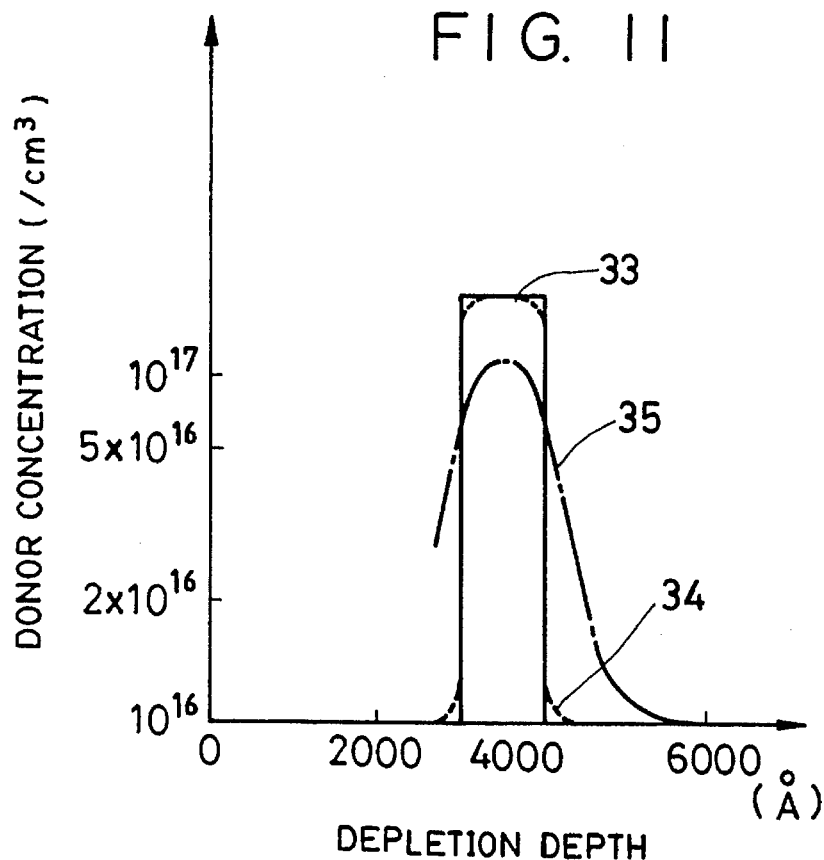
FIG. 11 illustrates a graph for showing the manner of diffusion in the first embodiment.

FIG. 11 illustrates a diffused state of Sn doped GaAs measured by secondary ion mass spectrometry (SIMS). Its abscissa indicates depth and its ordinate indicates donor concentration. A shape denoted by reference numeral 33 is an ideal doping shape, a curve denoted by reference numeral 34 indicates a diffused state of Sn at the time of growth at a temperature of 350° C. and a curve denoted by reference numeral 35 indicates a diffused state of Sn at the time of growth at a temperature of 550° C. From FIG. 11, it is known that the low temperature growth suppresses the diffusion. With respect to the impurity diffusion in GaAs, see, for example, "Applied Physics 54, 326 (1985)".

When the laser of the first embodiment is fabricated under the above-discussed condition, the inter-diffusion is suppressed due to the low temperature growth and such laser becomes capable of being integrated with electronic devices and the like without adverse effects.

The growth condition of the first embodiment will be explained in more detail.

The MBE method is used, the growth speed of GaAs is 0.7 µm/h and the As pressure is in a range from $0.5 \times 10^{-5}$~$5 \times 10^{-5}$ Torr. As described above, there is a tendency that $J_{th}$ at a high temperature (about 700° C.) is large if the As pressure is low. The substrate is always rotated at 12 rpm. As shown in FIG. 10, when the laser is fabricated, a current can flow therethrough if the substrate temperature is greater than 200° C. When it is less than 200° C., a resistance tends to increase.

The threshold current density has two local minimum points as shown in FIG. 10. Another reason therefor is that surface roughness of $Al_xGa_{1-x}As$ (x=0.5) cladding layer greatly has an adverse influence. It is considered that such roughness is great near the growth temperature of 500° C.

Figure 12:
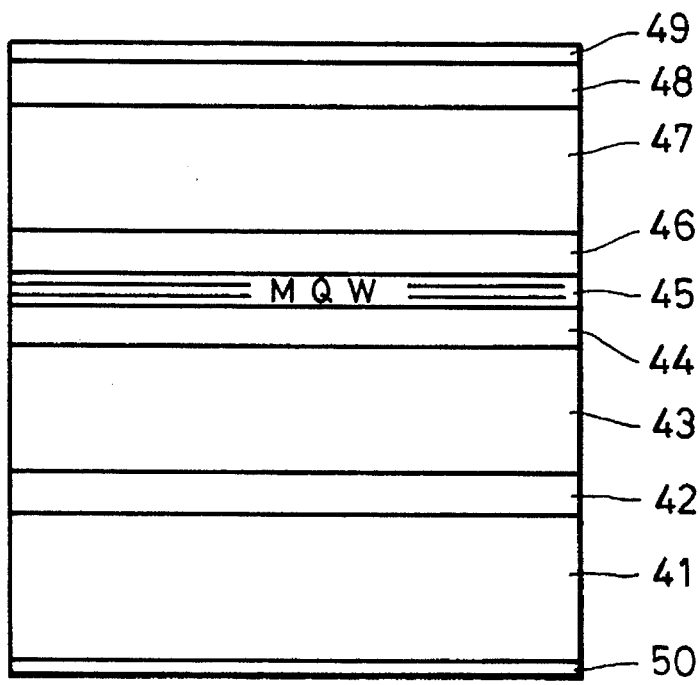
FIG. 12 is a view showing a second embodiment of the present invention.

FIG. 12 shows a second embodiment of the present invention. In the second embodiment, there are formed, on a p-GaAs substrate 41, a Be doped GaAs buffer layer 42 having a thickness of 0.5 µm and a Be doped $Al_{0.7}Ga_{0.3}As$ layer 43 having a thickness of 1.5 µm.

Figure 13:
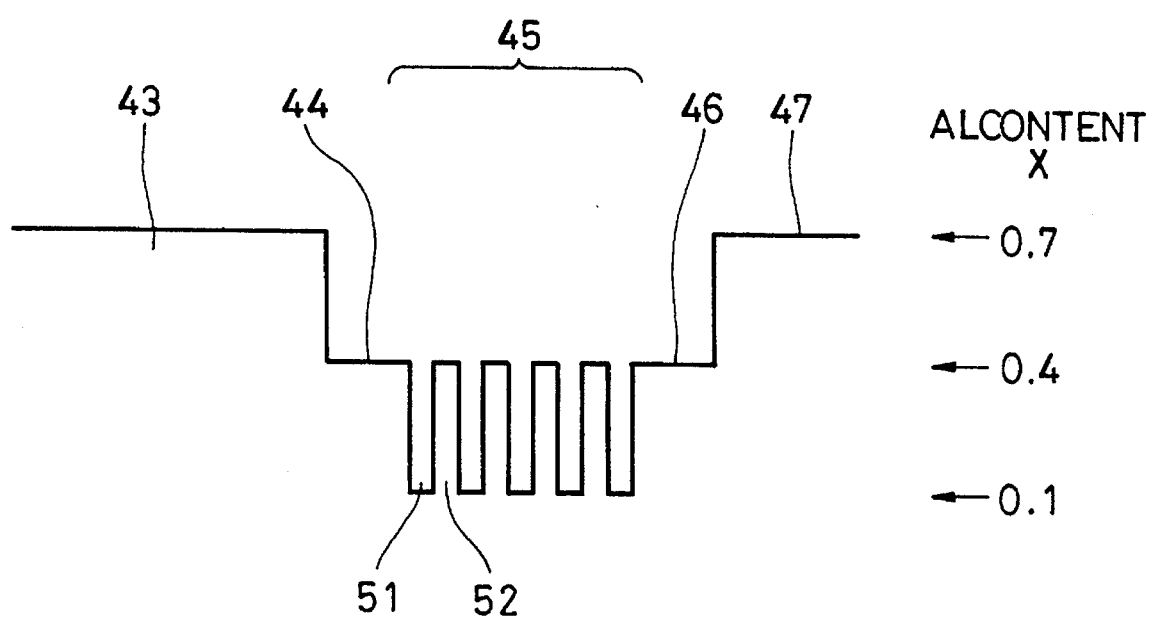
FIG. 13 is an illustration of the energy band structure of MQW of the second embodiment of the present invention.

Further, an undoped $Al_{0.4}Ga_{0.6}As$ light confinement layer 44 having a thickness of 1000 Å and an active layer 45 are formed. The active layer 45 is comprised of a multiple quantum well (MQW) layer. The band energy structure of the MQW layer 45 is shown in FIG. 13. First, an undoped $Al_{0.1}Ga_{0.9}As$ well layer 51 having a thickness of 70 Å is formed on the lower light confinement layer 44 and then an undoped $Al_{0.4}Ga_{0.6}As$ barrier layer 52 having a thickness of 120Å is formed. Such layer 51 and 52 are alternately layered, and on the fifth well layer 51 an undoped $Al_{0.4}Ga_{0.6}As$ upper light confinement layer 46 having a thickness of 1000Å is formed. In FIG. 13, an arrow indicates a direction of layered layers and numerals depicted at its right side indicate Al mole fractions or contents corresponding to respective band energy levels.

Further, on the upper light confinement layer 46, an Si doped $Al_{0.7}Ga_{0.3}As$ upper cladding layer 47 having a thickness of 1.5 µm and an Si doped GaAs cap layer 48 having a thickness of 0.5 µm are formed. Thereafter, an AuGe/Ni/Au electrode 49 at an n-side and a Cr/Au electrode 50 at a p-side are formed.

In the structure of the second embodiment, the threshold current density $J_{th}$ also has two local minimum points, and one is near the substrate temperature of 350° C. and the other one is near 700° C.

In the growth process of the second embodiment, in order to maintain the V/III group flux ratio at 2.5 or less than 2.5, or more preferably not greater than 2.0, the As pressure is optimized when each layer is grown. Typically, the As pressure is $1.2 \times 10^{-5}$ Torr when $Al_{0.7}Ga_{0.3}As$ cladding layer 43 is grown. In contrast, the As pressure is set to $5 \times 10^{-6}$ Torr when GaAs layer 42 is grown.

As the structure of an active layer, a normal GaAs active layer may be used in place of MQW and SQW structures. In a double-hetero (DH) laser having such normal GaAs active layer, high quality AlGaAs and GaAs layers can easily be obtained at low temperatures by setting the V/III group flux ratio to a value not greater than 2.5, or more preferably not greater than 2.0, at the time of growth of each layer. Thus, a laser device having a good performance can be realized.

Figure 14:
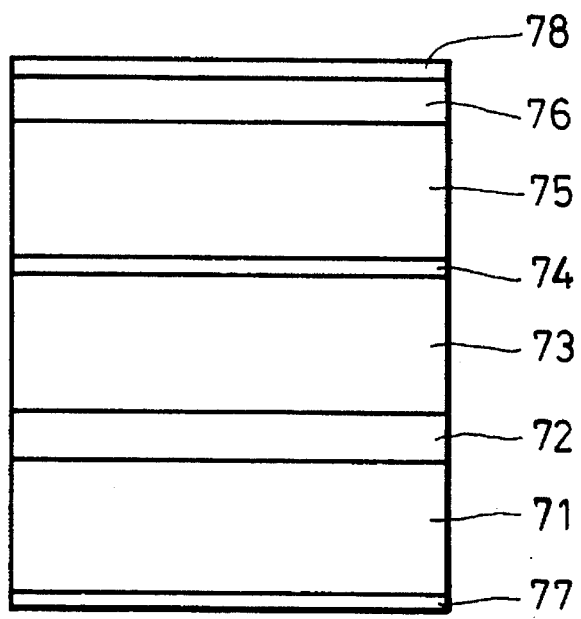
FIG. 14 is a view showing a third embodiment of the present invention.

FIG. 14 shows a third embodiment of the present invention. In the third embodiment, there are formed, on a p-GaAs substrate 71, a Be doped GaAs buffer layer 72 having a thickness of 0.5 µm and a Be doped $Al_xGa_{1-x}As$ cladding layer 73 having a thickness of 1.5 µm, an undoped GaAs active layer 74 having a thickness of 0.1 µm, an Si doped $Al_xGa_{1-x}As$ upper cladding layer 75 having a thickness of 1.5 µm and an Si doped GaAs cap layer 76 having a thickness of 0.5 µm are formed. Thereafter, an Au/AuGe electrode 78 at an n-side and an Au/Cr electrode 77 at a p-side are formed. The stripe width of the thus fabricated laser is 100 µm and its cavity length is 300 µm.

Figure 15:
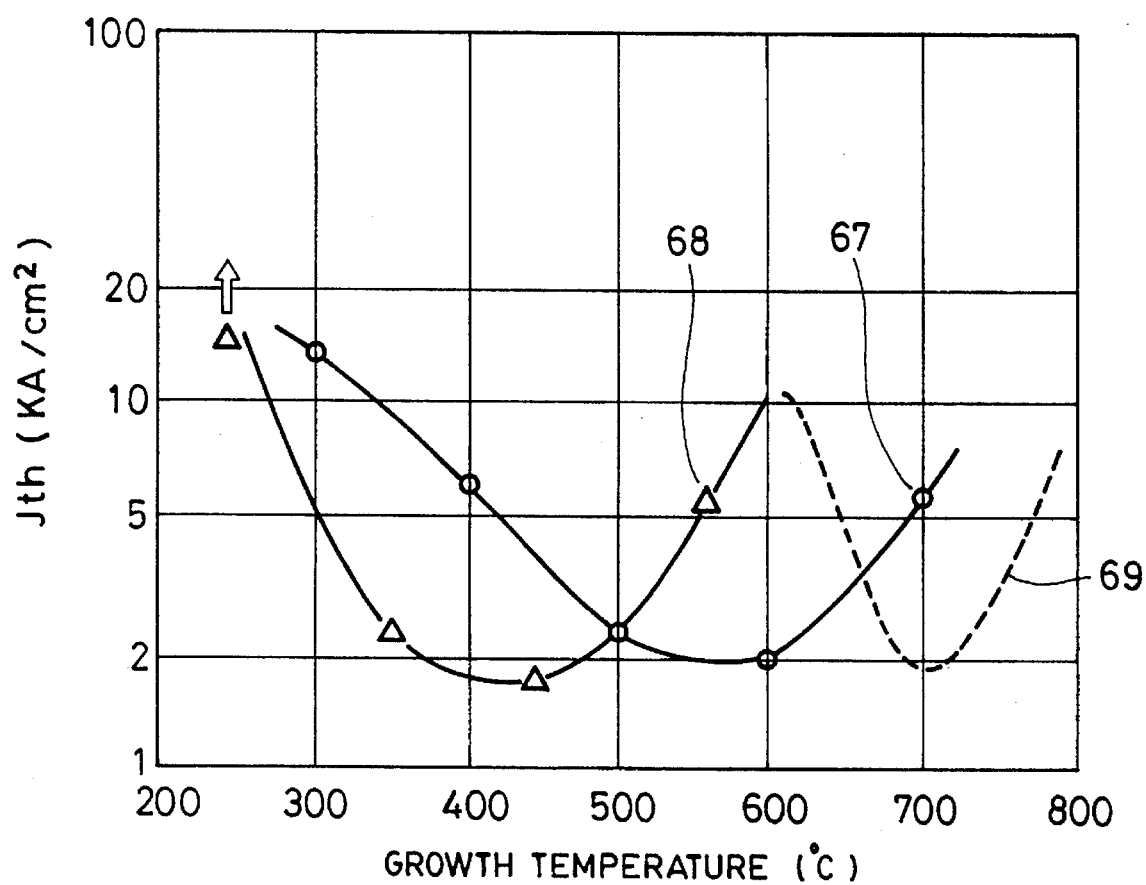
FIG. 15 illustrates a graph for showing the substrate temperature dependency of threshold current density of the third embodiment.

FIG. 15 illustrates how the threshold current density $J_{th}$ varies depending on the growth temperature when Al mole fractions of the cladding layers 73 and 75 are changed from 0.35 to 0.5. A curve 67 indicates the growth temperature dependency of $J_{th}$ when 0.35 and a curve 68 indicates that of $J_{th}$ when x=0.5.

As is apparent from FIG. 15, the growth temperature for achieving an optimum value or minimum value of the threshold current density $J_{th}$ shifts to a lower value as the Al mole fractions of the cladding layers 73 and 75 increase or the group V/III flux ratio at the time of growing the cladding layers descreases. The fact implies that the characteristic of semiconductor laser depends on the quality of cladding layers and that such quality strongly depends on the flux ratio. Here, it is also demonstrated that the growth under a small flux ratio is needed in order to effectively perform a low temperature growth of layers having a good quality.

As is shown by dotted lines 69 in FIG. 15, a curve of a case where As pressure is high (the curve 68 of a case where the Al mole fraction is 0.5 and the like) decreases also at temperatures similarly to the characteristic of SQW laser of the first embodiment (see FIG. 10).

Figure 16:
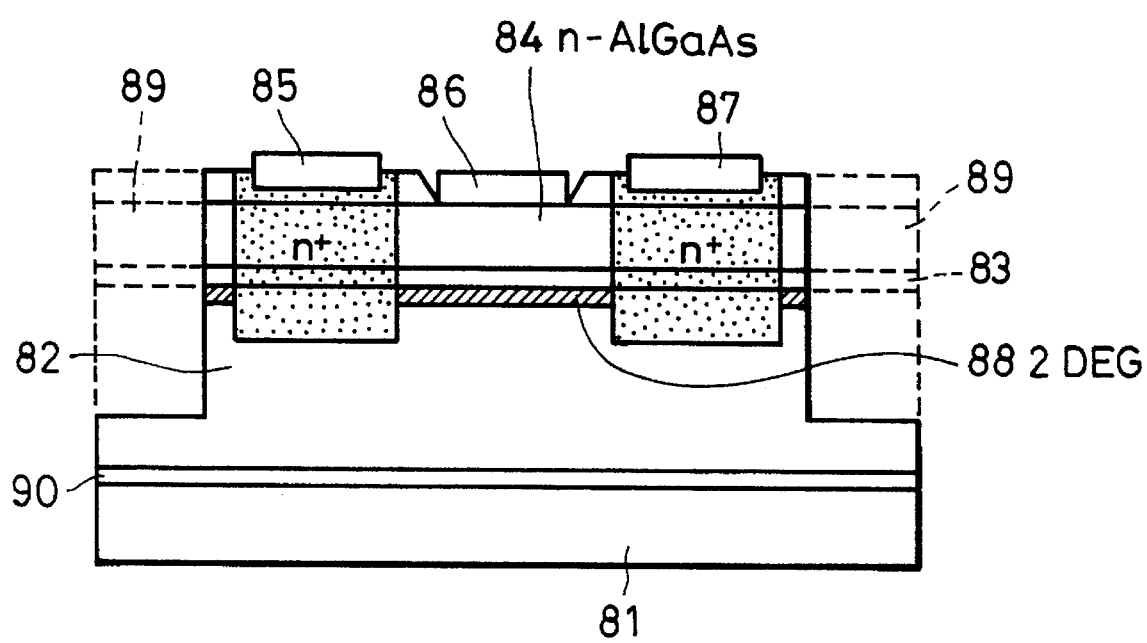
FIG. 16 is a view showing a fourth embodiment of the present invention.

FIG. 16 shows a fourth embodiment of the present invention. In the fourth embodiment having a HEMT structure, there are formed, on a semi-insulating GaAs substrate 81, an undoped GaAs layer 82 of an active layer region having a thickness of 1 μm, an $Al_{0.25}Ga_{0.75}As$ spacer layer 83 having a thickness of 100 Å, an Si doped $Al_{0.25}Ga_{0.75}As$ layer 84 having a thickness of 1 μm, a source 85, a gate 86, a drain 87 and isolations 89. Further, there is provided an undoped GaAs buffer layer 90 on the substrate 81. In FIG. 16, reference numeral 88 denotes a two-dimensional electron gas (2 DEG) 88, and Al mole fractions of the layers 83 and 84 are 0.25.

This device is featured in that the flux ratio at the time of growing layers is maintained at a value not greater than 2.5 or 2.0. The As pressure of AlGaAs layers 83 and 84 is set to $1\times10^{-5}$ Torr and that of GaAs layer 82 is set to $7\times10^{-6}$ Torr. Thereby, the V/III group flux ratio of AlGaAs is made 1.4 and that of GaAs is made 1.6. As a result, compound semiconductor crystals having a good quality are obtained even if the low temperature growth is conducted, and hence the impurity diffusion is depressed.

This sample is fabricated at the growth temperature of 350° C., and a high performance FET in which impurity diffusion is depressed has been obtained. Such result is also considered to appear especially in reverse HEMT, etc. (about reverse HEMT, see Cirillo, N. C., et al.: IEEE Electron. Device Lett. EDL-7:71, 1986).

The above-discussed low temperature growth principle can also be applied to the production of an AlGaAs laser on an Si substrate.

Figure 17:
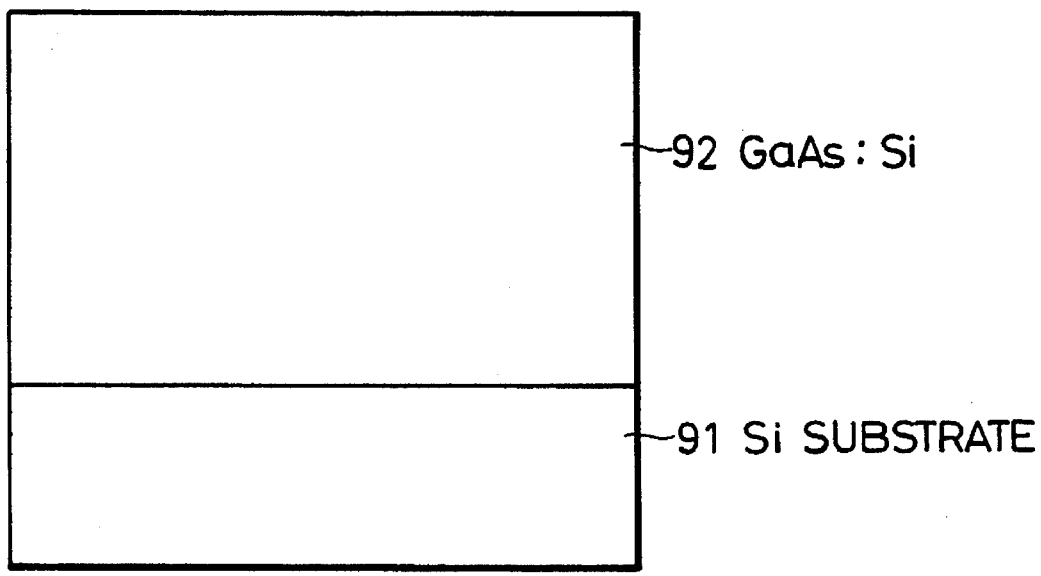
FIG. 17 is a view showing an example using an Si substrate.

FIG. 17 shows an example in which GaAs:Si (Si doped GaAs) 92 is grown on an Si substrate 91 at the substrate temperature of 350° C. In this example, a defect density of the Si doped GaAs 92 is $1\times10^{-5}$ cm$^{-3}$. An improvement of more than two digits is attained compared with the conventional one, and this is attributable to mollification of stress due to the difference in thermal expansion coefficient.

Figure 18:
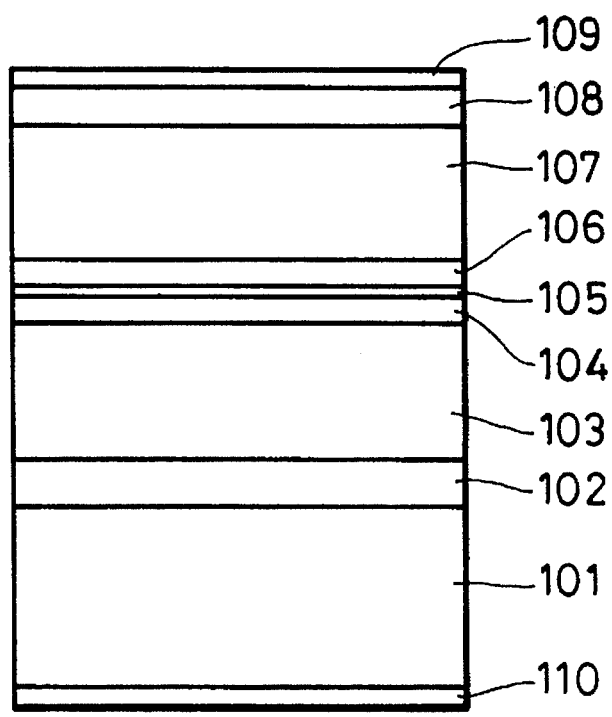
FIG. 18 is a view showing a fifth embodiment of the present invention.

FIG. 18 shows a fifth embodiment in which a semiconductor laser is fabricated on an Si substrate using the principle explained above. The Al mole fraction of cladding layers is 0.5.

In FIG. 18, there are formed, on a (001) surface of an n-type Si substrate 101, an Si doped GaAs buffer layer 102 having a thickness of 0.5 μm an Si doped $Al_{0.5}Ga_{0.5}As$ layer 103 having a thickness of 2.0 μm, an Si doped $Al_xGa_{1-x}As$ light confinement layer 104 having a thickness of 500Å (x is changed from 0.5 to 0.3), an undoped GaAs active layer 105 having a thickness of 70Å, a Be doped $Al_yGa_{1-y}As$ light confinement layer 106 having a thickness of 500Å (y is changed from 0.3 to 0.5), a Be doped $Al_{0.5}Ga_{0.5}As$ upper cladding layer 107 having a thickness of 1.5 μm and a Be doped GaAs cap layer 108. Thereafter, an p-type electrode 109 and an n-type electrode 110 are formed.

The MBE method is used as a growth method and the growth speed of the GaAs layer 105 is 0.7 μm/h. The substrate temperature is 350° C. and the substrate rotation speed is 12 rpm. The As pressure is controlled such that the flux ratio at the time of growth of respective layers is maintained at 2.5 or less than 2.5, more preferably 2.0 or less than 2.0. As a result, the threshold current density of 2 kA/cm$^2$ is achieved.

The substrate temperature dependency of threshold current density $J_{th}$ exhibits the same tendency as the first embodiment in which the GaAs substrate is used. As the substrate temperature increases, the threshold current density $J_{th}$ tends to increase due to the difference in thermal expansion coefficient between GaAs and Si.

Thus, even when the Si substrate is used, a high quality layer can be produced by setting the flux ratio to 2.5 or less than 2.5, more preferably 2.0 or less than 2.0 when at least the layer under the active layer (i.e., between substrate and active layer) is grown.

In such case where Si substrate is used, an MQW structure, GaAs having a thickness of about 0.1 μm and having no quantum effect other than the above-mentioned SQW may also be used as an active layer.

Further, also in the fourth embodiment of HEMT, the same advantage can be attained by making the substrate of semi-insulating Si. That is, such an FET having an excellent characteristic can be obtained by maintaining the flux ratio at a value of 2.5 or less than 2.5, more preferably 2.0 or less than 2.0, when at least the layer between substrate and active layer is grown.

Although the MBE method is used in the above-discussed embodiments, a layer or layers of the semiconductor device may be formed by the MEE (Migration-Enhanced Epitaxy) method (about the MEE method, see, for example, Japanese Journal of Applied Physics Vol. 28, No. 2 February, 1989, pp. 200–209).

In the MBE method, materials are supplied continuously, while in the MEE method, Ga, Al, As and the like are independently supplied alternately, or alternately with being each of the groups III and V as a unit. In the MEE method, the process is performed at low temperatures throughout, so that AlGaAs, GaAs and the like having a high quality (highly crystallized) can be obtained. But, since in the MEE method the materials are alternately supplied, its growth speed is slow. This drawback can be solved by combining the MEE method and the above-discussed growth method at a low flux ratio. Growth methods partially involving the MEE method will be described below.

For example, in the second embodiment of FIG. 12, the lower light confinement layer 44 made of undoped $Al_{0.4}Ga_{0.6}As$, MQW layer 45 and upper light confinement layer 46 made of undoped $Al_{0.4}Ga_{0.6}As$ can be grown by the MEE method. Here, Al and Ga are paired, and such pair and As are alternately applied to the substrate. The composition ratio or mole fraction is determined by respective flux amounts. As an application or irradiation method Al, Ga and As may independently be applied.

As a result, the substrate temperature dependency of threshold current density is substantially the same as that of the second embodiment, but since the MEE method is used in this example, the threshold current density of 700 A/cm$^2$ can be obtained. Similarly, in the first embodiment, the light confinement layers 14 and 16 and the active layer 15 can be formed by the MEE method. The growth temperature is constantly maintained at 300° C., and the threshold current density of 600 A/cm$^2$ can be obtained.

Since diffusion is depressed in the low temperature growth, the lower the growth temperature, the better.

In the fourth embodiment of FIG. 16, the GaAs layer may also be grown by the MEE method. A preferably result can be obtained.

The portion to be formed by MEE method is not necessarily limited to a active region such as an active layer of a laser, a two-dimensional electron gas and channel layer of an FET and the like, but other portions such as a buffer layer may be grown by the MEE method. But, in the case of a laser, the active layer is most effectively formed by the MEE method.

Such a crystal growth method can also be applied to the fifth embodiment in which the Si substrate is used, and layers grown at low temperatures are further improved in quality by producing part of layers by the MEE method.

In FIG. 18, the light confinement layers 104 and 106 and the active layer 105 can be grown by the MEE method and the other layers can be grown by the low flux ratio growth method. In the case where the active layer is comprised of an MQW layer, an upper portion (its thickness is 2000 521 ) of the cladding layer 103, light confinement layers 104 and 106 and the MQW active layer can be formed by the MEE method. Such growth method is also applicable to an HEMT type FET in which Si substrate is used, and highly pure GaAs layer (see the layer 82 shown in FIG. 16) can be grown by alternately supplying Ga and As. Such growth method is also applicable to a reverse HEMT device effectively.

Thus, stress due to the difference in thermal expansion coefficient is suppressed by using the MEE method and low flux ratio growth method in the example where the Si substrate is used. Excellent GaAs, AlGaAs devices can be formed on the Si substrate at low temperatures, which could not be achieved conventionally.

Next, reference will be made to a device including ZnSe layers and the like to which the low temperature growth is required for avoiding inter-diffusion. The principle of the present invention can also be applied to such device.

Figure 19:
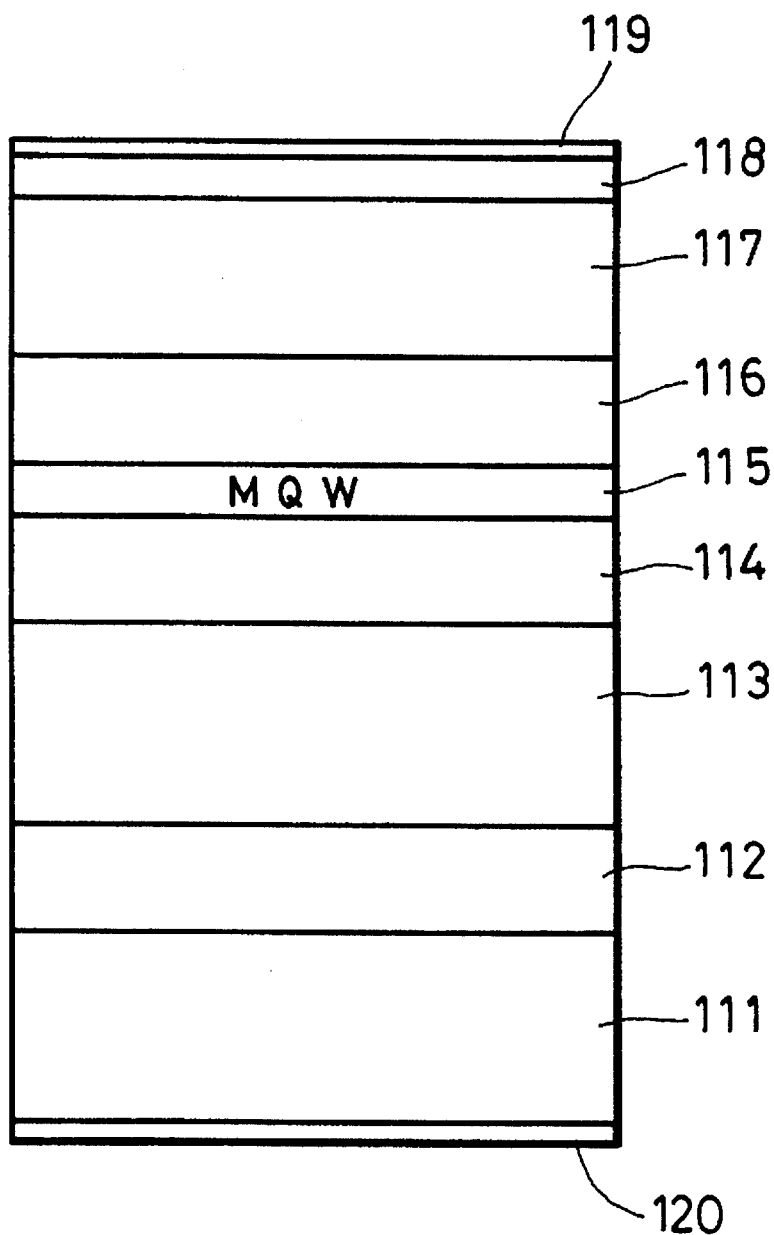
FIG. 19 is a view showing a sixth embodiment of the present invention.

FIG. 19 shows a sixth embodiment which is ZnSe-GaAs supper-lattice laser fabricated at a growth temperature of 300° C.

In FIG. 19, there are formed, on an n-type GaAs substrate 111, an Si doped GaAs buffer layer 112 having a thickness of 0.5 μm, an Si doped $Al_{0.5}Ga_{0.5}As$ layer 113 having a thickness of 1.5 μm (carrier concentration: $8\times10^{17}$ cm$^{-3}$), a Ga doped ZnSe layer 114 having a thickness of 0.5 μm (carrier concentration: $1\times10^{18}$ cm$^{-3}$), and an MQW active layer 115. The active layer 115 is structured by alternately layering an undoped $Al_{0.3}Ga_{0.7}As$ well layer having a thickness of 60Å and an undoped ZnSe barrier layer having a thickness of 100 Å, and is composed of five well layers and four barrier layers.

There are further formed, on the active layer 115, an Li and N (nitrogen) doped ZnSe upper cladding layer 116 having a thickness of 0.5 μm, a Be doped $Al_{0.5}Ga_{0.5}As$ upper cladding layer 117 having a thickness of 1.0 μm and a Be doped GaAs cap layer 118. Thereafter, a p-type Au/Cr electrode 119 and an n-type AuGe/Ni/Au electrode 120 are formed.

The thus fabricated semiconductor laser exhibits a preferably I (current)-V (voltage) characteristic, and it is demonstrated that no inter-diffused layers are formed.

Figure 1:
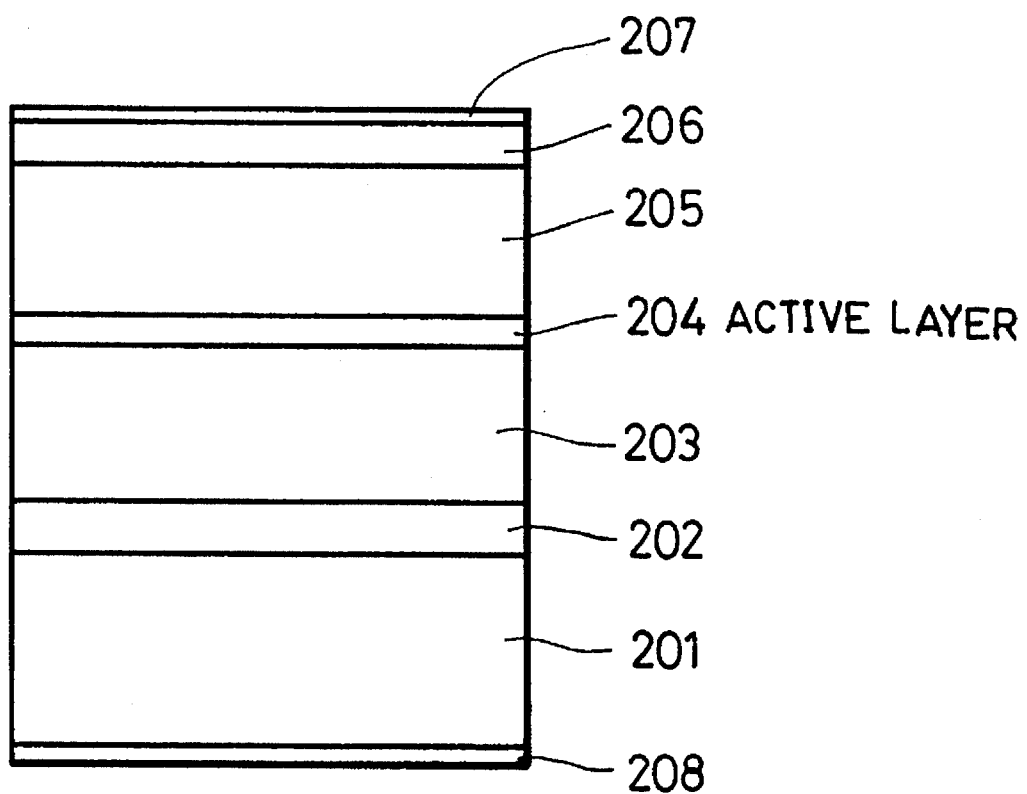
FIG. 1 is a view for explaining a prior art example.
Figure 2:
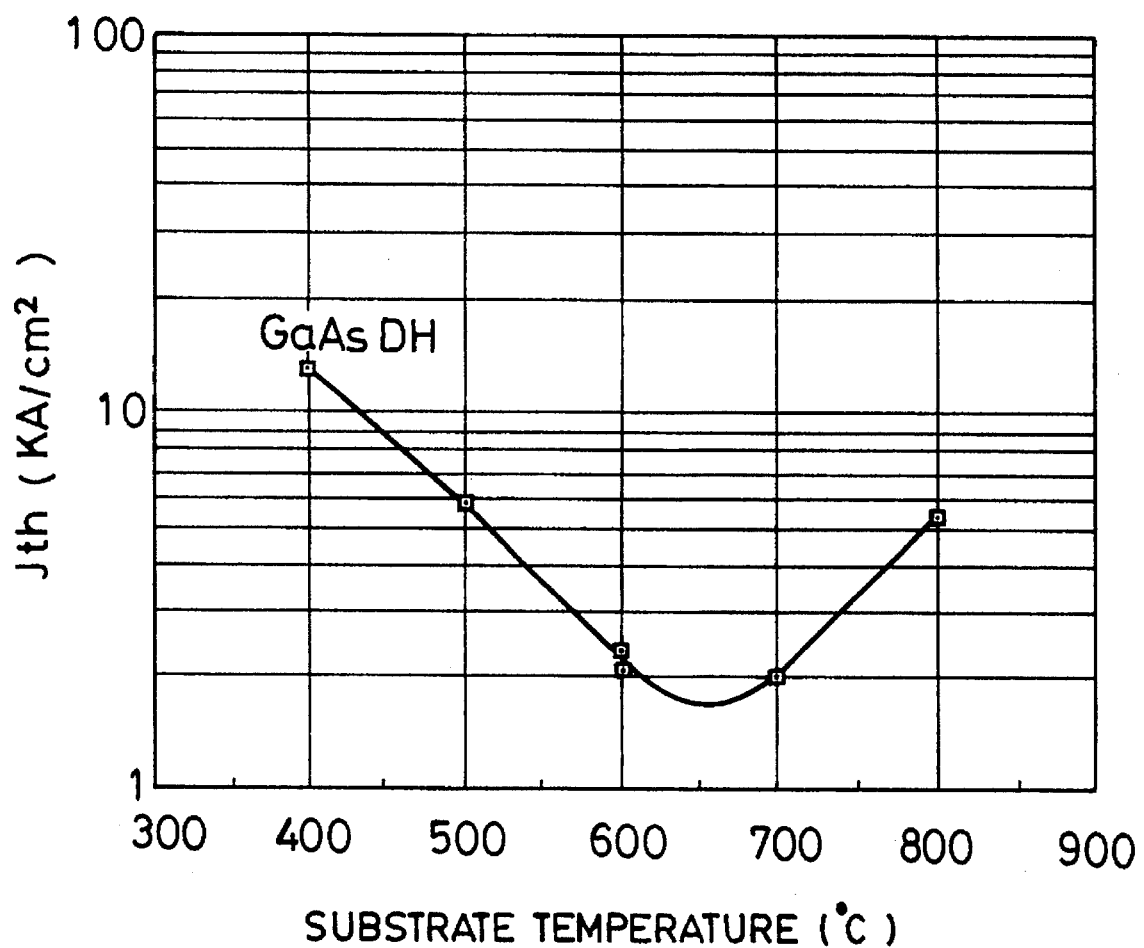
FIG. 2 illustrates a graph for showing the substrate temperature dependency of threshold current density of the prior art example of FIG. 1.
Figure 3:
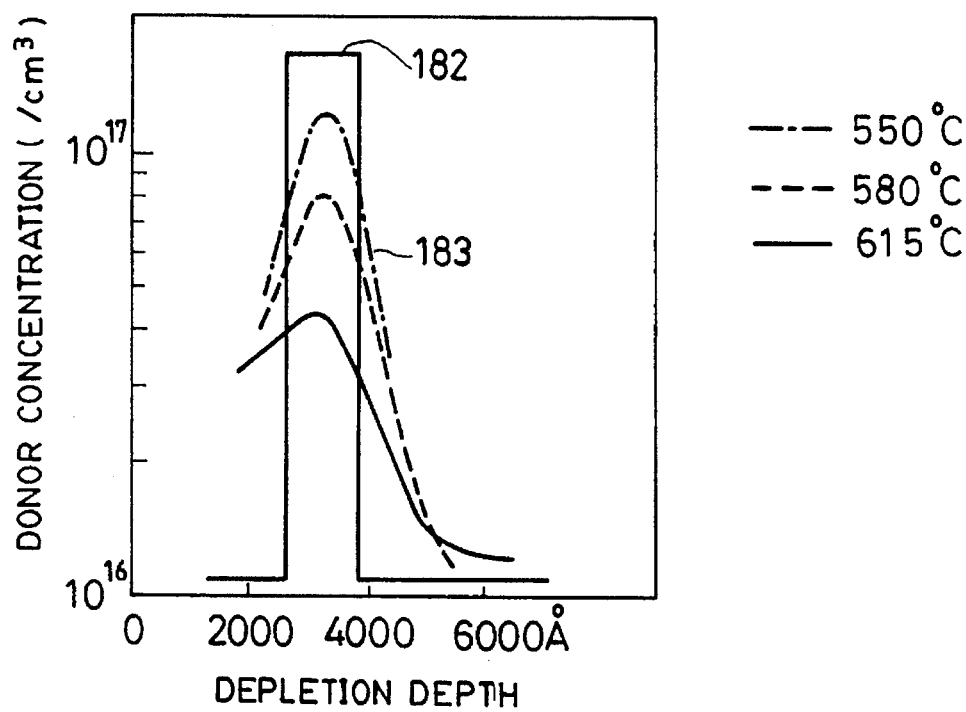
FIG. 3 illustrates a graph for showing the manner of diffusion in a prior art example.
Figure 5:
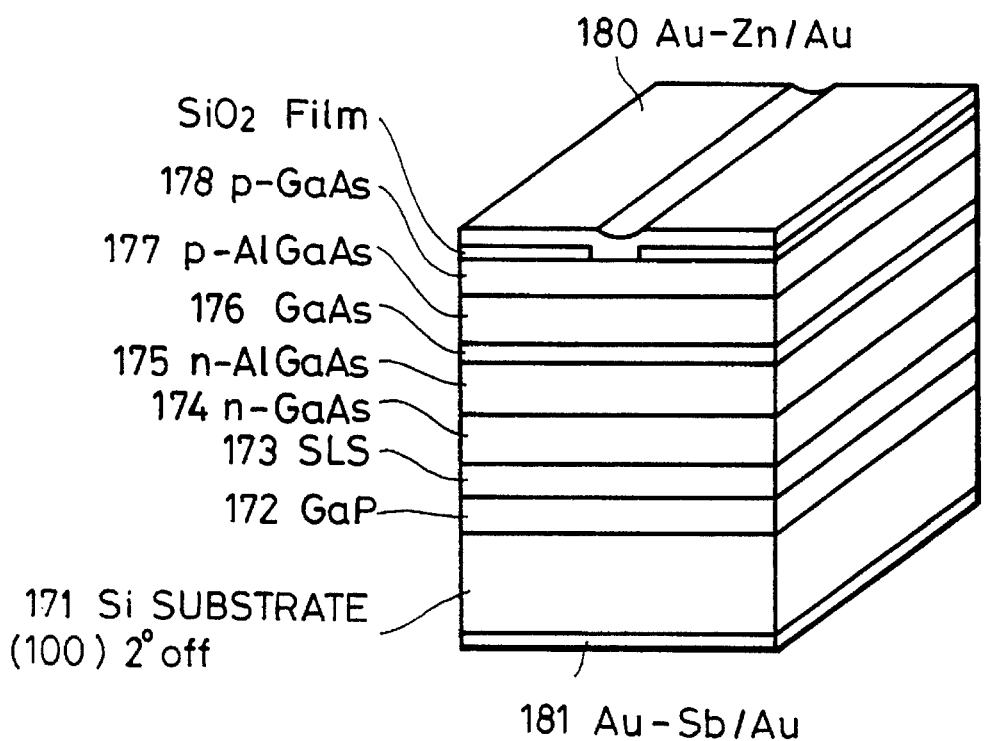
FIG. 5 is a view for explaining a prior art example using an Si substrate.
Figure 4A:
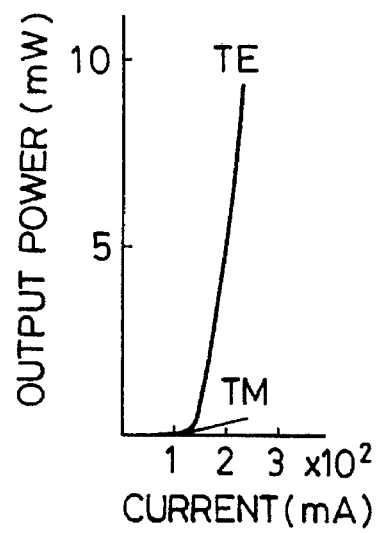
FIGS. 4A and 4B respectively illustrate graphs for explaining characteristics of prior art examples.
Figure 4B:
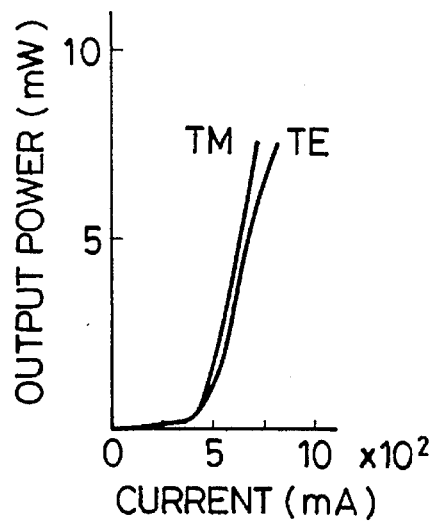
Figure 6:
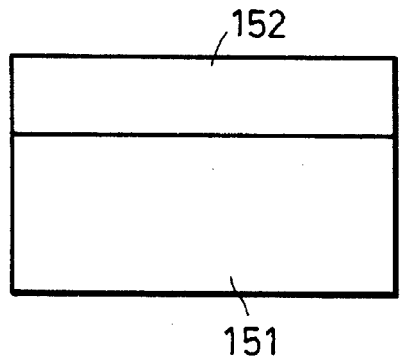
FIG. 6 is a view showing a prior art example including a ZnSe layer.
Figure 7:
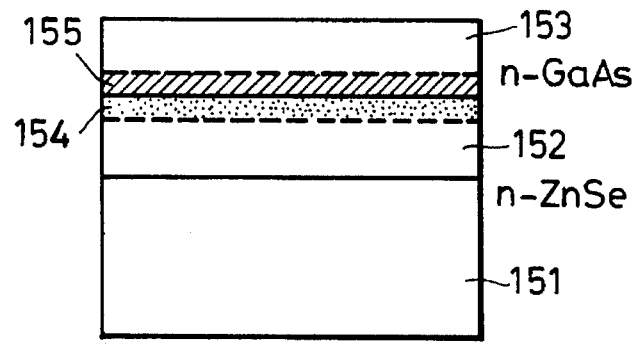
FIG. 7 is a view for explaining the prior art example of FIG. 6.
Figure 8A:
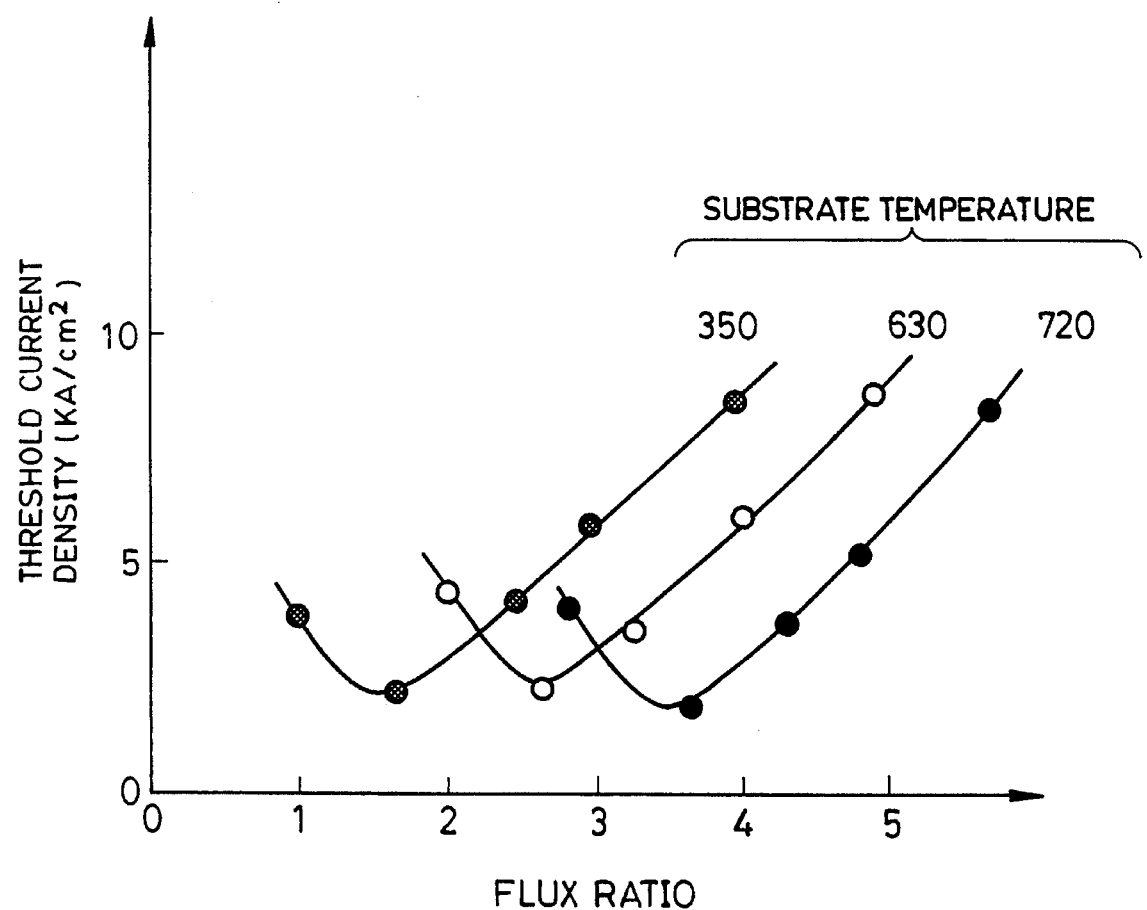
FIGS. 8A–8C are respectively graphs for explaining the basic idea of the present invention.
Figure 8B:
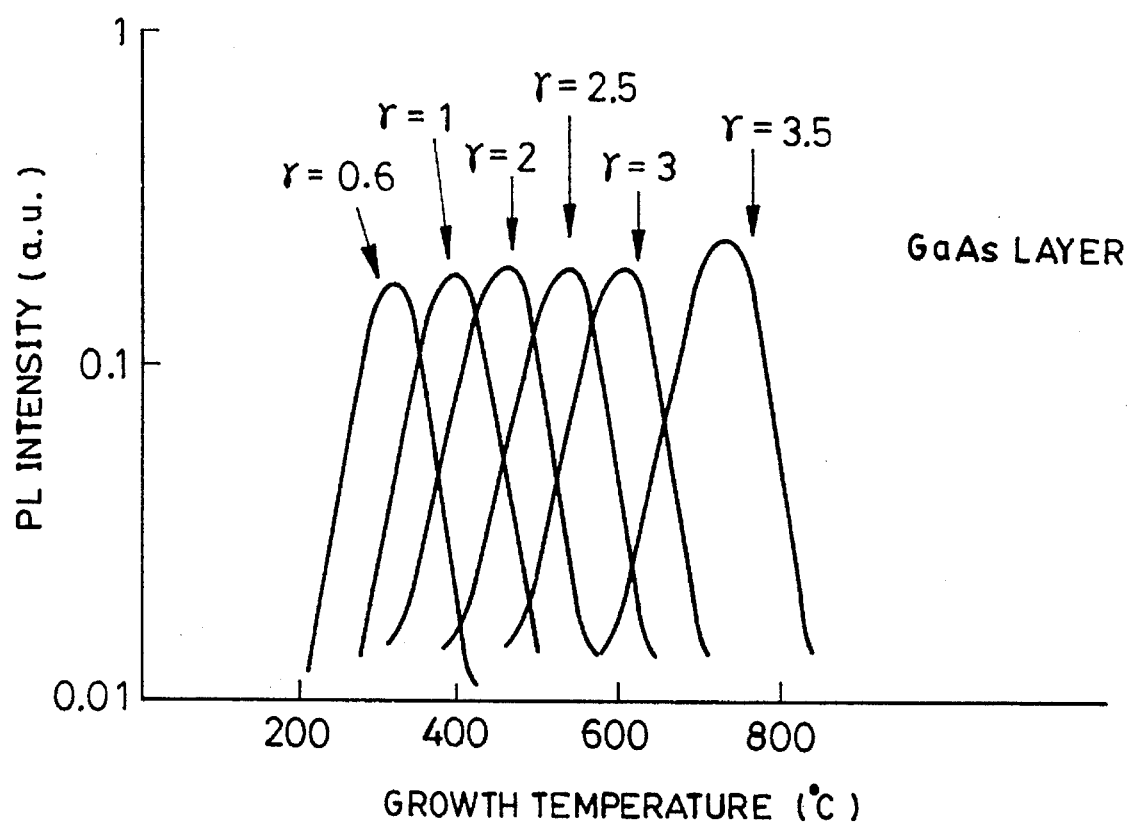
Figure 8C:
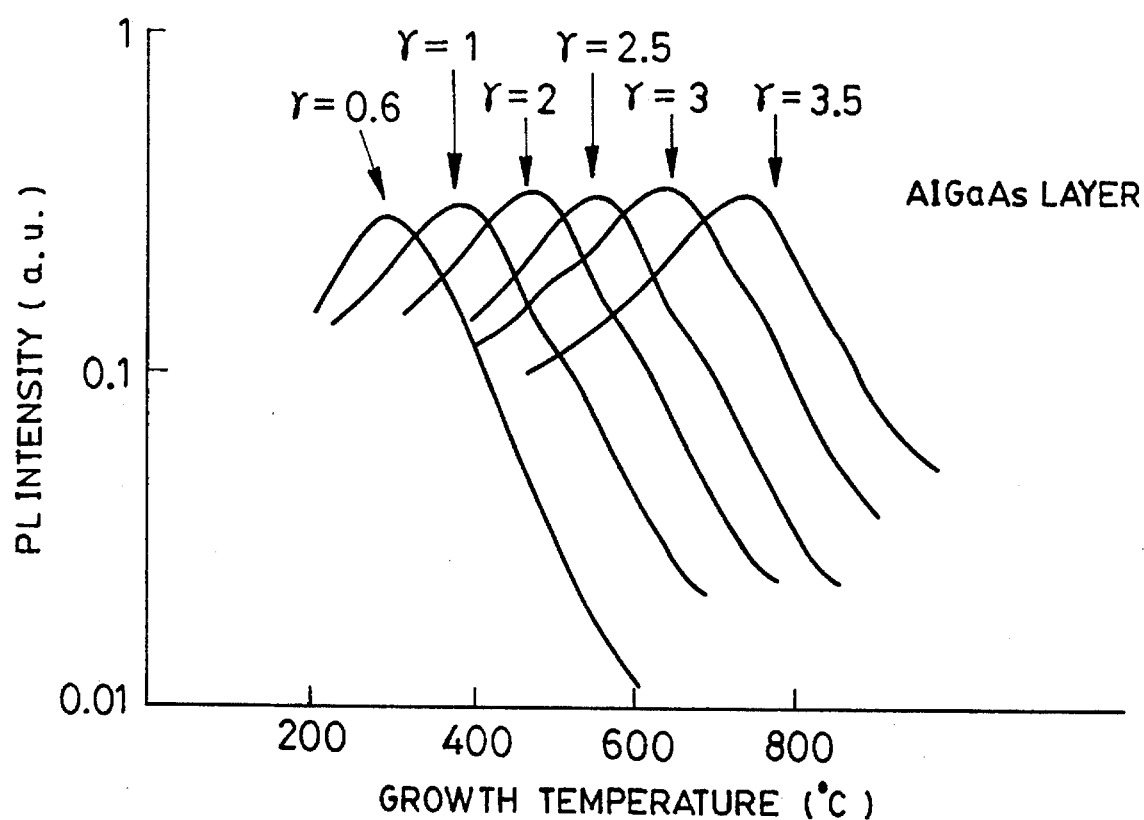

When n-type layers as shown in FIG. 7 are formed by such low temperature growth method and electrodes are formed, the I-V characteristic also exhibits a clear ohmic relationship. In this case, adverse influences of inter-diffused layers are negligible if the growth temperature is set to 500° C. or less.

Thus, laser devices of AlGaAs series can be fabricated by the low temperature growth method, and hence it becomes possible to integrate devices of low temperature growth such as ZnSe, ZnSeS, ZnTe devices and the like. As a result, integration of materials of ZnSe, AlGaAs, InGaP, GaP and the like becomes possible and active flat panel displays and the like become available.

The integration with an FET of GaAs series is also possible at low temperatures. In the foregoing, integration with the II–IV group is mainly described, but the low flux ratio growth techniques are also required for integration with materials which need low temperature growth and are also applicable to other materials such as GaP, InGaP and the like.

The combination of the MEE method and the low flux ratio growth method is also applicable to the sixth embodiment of FIG. 19, thereby further improving qualities of layers grown at low temperatures.

In the sixth embodiment, the ZnSe layers 114 and 116 and the active layer 115 can be layered by using the MEE method. Compared with the I–V characteristic of a case where the MEE method is not used, a rise of this I–V characteristic is improved and it is demonstrated that the MEE method improves the quality of crystals. The region which is to be grown by the MEE method is not restricted, but it is generally considered that an active area and an area close thereto of the semiconductor laser, FET and the like are desirable.

A temperature calibration method in the MBE growth method used in the low flux ratio growth will be explained below.

Calibration is conducted by utilizing melting points of indium (In) and lead (Pb) and a temperature at which an oxide film on a substrate surface of GaAs is removed. In and Pb are applied to the GaAs substrate and the substrate is mounted to a non-In holder to perform the measurement of temperature.

Figure 20:
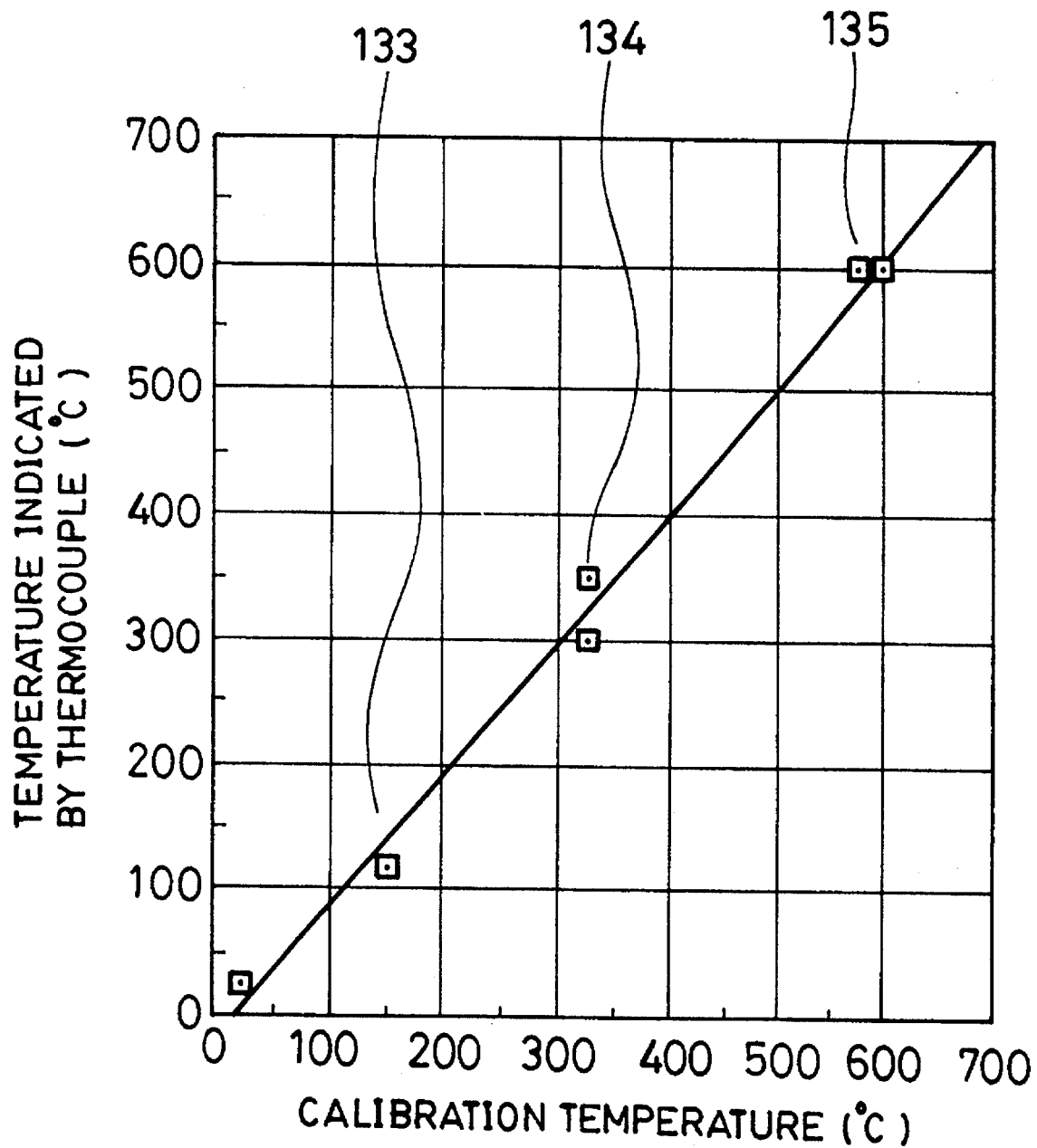
FIG. 20 illustrates a graph for showing the substrate temperature calibration in MBE apparatus.

The result is illustrated in FIG. 20. The ordinate indicates the temperature indicated by the thermocouple disposed in the MBE apparatus. The abscissa indicates the calibration temperature calibrated by the melting points of In and Pb and the oxide removal temperature of GaAs. Reference numeral 133 indicates 157° C. of the melting point of In, reference numeral 134 indicates 328° C. of melting point of Pb and reference numeral 135 indicates 580° C.–600° C. of the oxide removal temperature of GaAs. It can be seen that values indicated by the thermocouple are about equal to the growth temperatures in the used MBE apparatus.

In the foregoing, AlGaAs series materials are mainly mentioned, but the principle of the present invention is effective for other materials such as GaP, AlGaP, AlGaInP, InAsP, InSb and the like. Basically, the idea of the present invention resides in that growth of crystal layers at low temperatures is achieved by controlling re-evaporation of supplied materials. Therefore, the kinds of materials given as examples are irrelevant to the idea of the present invention.

As has been described in the foregoing, crystal growth is performed at low flux ratios in the present invention, so that compound semiconductor crystal layers and semiconductor devices can be fabricated at low temperatures equal to or less than 500° C.

Therefore, suppression of stress due to the inter-diffusion of dopants and the like and the difference in thermal expansion coefficients can be achieved, and an ideal device can be produced by processes having a great degree of freedom.

Thus, the integration of semiconductor lasers, field effect transistors, detectors, light waveguides and the like can be effected according to the present invention, and opto-electronic integrated circuits (OEIC) and electronic integrated circuits (IC) can be fabricated. Further, the present invention is applicable to three-dimensional integrated circuits expected in the future.

The OEIC and integrated circuits of compound semiconductor feature a high speed operation, and they have been studied as components in optical communication systems, computers and measuring devices. The present invention provides an important method for achieving a high reliability and inexpensive cost of those integrated circuits by the low temperature growth techniques which are dispensable for integration of semiconductor devices.

While there have been shown and described what are considered preferred embodiments of the present invention, it will be obvious to those skilled in the art that various changes and modifications may be made therein without departing from the invention as defined by the following claims.

What is claimed is:

1. A method for producing a compound semiconductor device, said method comprising the steps of:

preparing a substrate; and forming, on the substrate, a crystal layer with materials belonging to at least first and second different groups of chemical elements on the periodic table of elements under a crystal growth condition under which a flux ratio is a value equal to the number of arrival molecules of the material of the first group having a higher vapor pressure divided by the number of arrival molecules of the material of the second group having a lower vapor pressure is in a range from 0.6 to 1.0 at a substrate temperature in a range from 300° C. to 400° C.

2. A method for producing a compound semiconductor device according to claim 1, wherein the first and second groups are respectively chemical elements belonging to groups V and III on the periodic table of elements.

3. A method for producing a compound semiconductor device according to claim 2, wherein the materials belonging to the groups V and III on the periodic table of elements are respectively As and at least Ga.

4. A method for producing a compound semiconductor device according to claim 1, wherein a plurality of the crystal layers are formed on the substrate and at least one layer of the crystal layers is produced by the MEE method.

5. A method for producing a compound semiconductor device according to claim 1, further comprising a step of forming an active layer on the crystal layer.

6. A method for producing a compound semiconductor device according to claim 5, further comprising a step of forming lower and upper light confinement layers sandwiching the active layer and wherein the active layer and the lower and upper light confinement layers are produced by the MEE method.

7. A method for producing a compound semiconductor device according to claim 5, further comprising a step of forming lower and upper cladding layers sandwiching the active layer and wherein the active layer and a part of the lower and upper cladding layers are produced by the MEE method.

* * * * *

UNITED STATES PATENT AND TRADEMARK OFFICE
CERTIFICATE OF CORRECTION

PATENT NO. : 5,585,306

DATED : December 17, 1997

INVENTOR(S) : SEIICHI MIYAZAWA

It is certified that error appears in the above-identified patent and that said Letters Patent is hereby corrected as shown below:

COLUMN 1

Line 54, "the" should read --The--.

COLUMN 2

Line 30, "monolithicly" should read --monolithically--.
    Line 46, "temperature" (first occurrence) should read --temperatures--.
    Line 59, "reported" should read --been reported--.

COLUMN 3

Line 53, "colours" should read --colors--.
    Line 56, "colours" should read --colors--.

COLUMN 6

Line 28, "state," should read --stated,--.

COLUMN 7

Line 12, "GA:" should read --Ga:--.

COLUMN 8

Line 60, "ad" should read --and--.

UNITED STATES PATENT AND TRADEMARK OFFICE
CERTIFICATE OF CORRECTION

PATENT NO. : 5,585,306

DATED : December 17, 1997

INVENTOR(S): SEIICHI MIYAZAWA

It is certified that error appears in the above-identified patent and that said Letters Patent is hereby corrected as shown below:

COLUMN 9

Line 8, "state" should read --stated--.
  Line 43, "$_5$~5x10$^{-5}$Torr." should read --$^5$~5x10$^{-5}$Torr.--.

COLUMN 10

Line 1, "layer 51" should read --layers 51--.
  Line 49, "0.35" should read --x=0.35--.
  Line 66, "temperatures" should read --high temperatures--.

COLUMN 11

Line 43, "0.5 $\mu$m" should read --0.5 $\mu$m,--.

COLUMN 12

Line 24, "being" should be deleted.
  Line 42, "method" should read --method,--.
  Line 56, "preferably" should read --preferable--.
  Line 59, "a active" should read --an active--.

COLUMN 13

Line 7, "2000 521" should read --2000Å)--
  Line 8, ")" should be deleted.
  Line 48, "erably" should read --erable--.

UNITED STATES PATENT AND TRADEMARK OFFICE
CERTIFICATE OF CORRECTION

PATENT NO. : 5,585,306

DATED : December 17, 1997

INVENTOR(S) : SEIICHI MIYAZAWA

Page 3 of 3

It is certified that error appears in the above-identified patent and that said Letters Patent is hereby corrected as shown below:

COLUMN 14

Line 34, "melting" should read --the melting--.

Signed and Sealed this

Twenty-fourth Day of June, 1997

Attest:

BRUCE LEHMAN

Attesting Officer

Commissioner of Patents and Trademarks